United States Patent
Kwak et al.

(10) Patent No.: US 7,838,880 B2
(45) Date of Patent: Nov. 23, 2010

(54) FLAT PANEL DISPLAY DEVICE

(75) Inventors: Won-Kyu Kwak, Suwon-si (KR);
Byung-Hee Kim, Suwon-si (KR);
Sang-Won Lee, Suwon-si (KR);
In-Young Jung, Suwon-si (KR);
Myung-Sup Kim, Suwon-si (KR)

(73) Assignee: Samsung Mobile Display Co., Ltd., Suwon-si, Gyeonggi-do (KR)

( * ) Notice: Subject to any disclaimer, the term of this patent is extended or adjusted under 35 U.S.C. 154(b) by 285 days.

(21) Appl. No.: 11/529,470

(22) Filed: Sep. 29, 2006

(65) Prior Publication Data

US 2007/0075313 A1 Apr. 5, 2007

(30) Foreign Application Priority Data

Sep. 30, 2005 (KR) .................. 10-2005-0092147

(51) Int. Cl.
*H01L 29/04* (2006.01)
*H01L 29/76* (2006.01)
*H01L 31/06* (2006.01)

(52) U.S. Cl. .................. 257/59; 257/40; 257/72; 257/79; 257/99; 257/100; 257/E21.476; 257/E21.495; 257/E21.567; 257/E27.111; 257/E51.022; 315/169.3; 438/22; 438/29; 438/30; 438/155; 438/158

(58) Field of Classification Search .............. 257/40, 257/59, 72, 79, 99, 100, E21.476, E21.495, 257/E21.567, E27.111, E51.022; 315/169.3; 438/22, 29, 30, 156, 158
See application file for complete search history.

(56) References Cited

U.S. PATENT DOCUMENTS

| | | | | |
|---|---|---|---|---|
| 6,586,286 | B2 * | 7/2003 | Park et al. | 438/155 |
| 7,247,881 | B2 * | 7/2007 | Lee et al. | 257/72 |
| 7,304,711 | B2 * | 12/2007 | Takeguchi et al. | 349/152 |
| 2003/0197177 | A1 * | 10/2003 | Baek et al. | 257/59 |
| 2004/0080688 | A1 | 4/2004 | Ishida | |
| 2006/0175286 | A1 * | 8/2006 | Matsushita et al. | 216/23 |
| 2006/0202615 | A1 * | 9/2006 | Murakami et al. | 313/506 |

FOREIGN PATENT DOCUMENTS

| | | |
|---|---|---|
| JP | 2004-158826 | 6/2004 |
| JP | 2005-183209 | 7/2005 |

* cited by examiner

*Primary Examiner*—Dao H Nguyen
(74) *Attorney, Agent, or Firm*—Lee & Morse, P.C.

(57) ABSTRACT

A flat panel display device that includes a clad unit that may prevent terminals of a pad unit from becoming corroded or damaged by an etching solution during etching. The flat panel display device may include a display unit, a pad unit which may include a plurality of terminals electrically connecting the display unit to external devices, and a clad unit which may cover at least side end portions of the terminals, in which the clad unit may be composed of an insulating material.

9 Claims, 3 Drawing Sheets

FLAT PANEL DISPLAY DEVICE

BACKGROUND OF THE INVENTION

1. Field of the Invention

The present invention relates to a flat panel display device. More particularly, the present invention relates to a flat panel display device in which a terminal of a pad unit may include a clad unit.

2. Description of the Related Art

Flat panel display devices, such as liquid crystal display (LCD) devices, organic light emitting display (OLED) devices, and inorganic light emitting display (ILED) devices may use conductive aluminum group metal wires to reduce wire resistance. However, conductive aluminum group metal wires may be damaged during an etching process.

A three-layer structure wire composed of titanium, aluminum, and titanium nitride has been considered so as to prevent damage to the wires. However, in this exemplary structure, corrosion of a middle layer (aluminum layer) may occur due to the penetration of an etching solution during an etching process.

Also, a method has been considered that relates to protecting the aluminum layer. In such a method, a reflection film may be formed along the sides of the wires and a transparent conductive film may surround the reflection film. However, in this method, the reflection film that surrounds the wire may also be formed of an aluminum group metal. Accordingly, the protection of the wires may be limited. That is, even though the reflection film may be formed, an etching solution introduced when patterning the transparent conductive film may corrode the wires. The problem may be more severe when the wire is a terminal that may be exposed to the outside of a sealing member.

SUMMARY OF THE INVENTION

The present invention is therefore directed to a flat panel display device, which substantially overcomes one or more of the problems due to the limitations and disadvantages of the related art.

It is therefore a feature of an exemplary embodiment of the present invention to provide a flat panel display device that may protect a pad unit having terminals from becoming damaged or corroded.

It is therefore another feature of an exemplary embodiment of the present invention to provide a flat panel display device that reduces a connection failure between an external electronic device and the terminal when the thickness of the clad unit is properly configured.

At least one of the above and other features and advantages of the present invention may be realized by providing a flat panel display device that may include a display unit, a pad unit that may include a plurality of terminals electrically connecting the display unit to external devices, and a clad unit which may cover at least side end portions of the terminals, in which the clad unit is composed of an insulating material.

The terminals may include a conductive layer composed of aluminum or an aluminum alloy.

The terminals may include a first conductive layer, a second conductive layer, and a third conductive layer, in which the second conductive layer may be composed of aluminum or an aluminum alloy.

One of the first conductive layer and the third conductive layer may be composed of at least one of Cr, Cr alloy, Mo, Mo alloy, W, and W alloy. One of the first conductive layer and the third conductive layer may be composed of at least one of Ti, Ti alloy, Ta, and Ta alloy.

The clad unit may be composed of an organic insulating material. The clad unit may be composed of polymer derivatives having a phenol group, an acryl group, an imide group, an arylether group, an amide group, a fluorine group, a p-xylene group, or a vinyl alcohol group, or a mixture thereof.

The clad unit may be composed of an inorganic insulating material. The clad unit may be composed of at least one of $SiO_2$, $SiN_x$, $SiON$, $Al_2O_3$, $TiO_2$, $Ta_2O_5$, $HfO_2$, $ZrO_2$, BST, and PZT.

At least one of the above and other features and advantages of the present invention may be realized by providing a flat panel display device that may include a substrate, a thin film transistor that may be disposed on the substrate, an insulating film that may cover the thin film transistor, a pixel electrode that may be disposed on the insulating film and electrically connected to the thin film transistor, a terminal that may be disposed on the substrate and connecting the thin film transistor and the pixel electrode to external electronic devices, and a clad unit that may cover at least side end portions of the terminal, in which the clad unit may be composed of an insulating material.

The terminal may include a conductive layer composed of aluminum or an aluminum alloy.

The terminal may include a first conductive layer, a second conductive layer, and a third conductive layer, in which the second conductive layer may be composed of aluminum or an aluminum alloy.

One of the first conductive layer and the third conductive layer may be composed of at least one of Cr, Cr alloy, Mo, Mo alloy, W, and W alloy. One of the first conductive layer and the third conductive layer may be composed of at least one of Ti, Ti alloy, Ta, and Ta alloy.

The clad unit may be composed of the same material as the insulating film. The clad unit may be thinner than the insulating film.

The terminal may be coupled to the external electronic device by an anisotropic conductive adhesive.

The insulating film may be composed of an organic material. The organic material is composed of polymer derivatives having a phenol group, an acryl group, an imide group, an arylether group, an amide group, an fluorine group, a p-xylene group, or a vinyl alcohol group, or a mixture thereof.

The insulating film may be composed of an inorganic material. The inorganic material may be composed of at least one of $SiO_2$, $SiN_x$, $SiON$, $Al_2O_3$, $TiO_2$, $Ta_2O_5$, $HfO_2$, $ZrO_2$, BST, and PZT.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF THE INVENTION

Figure 1:
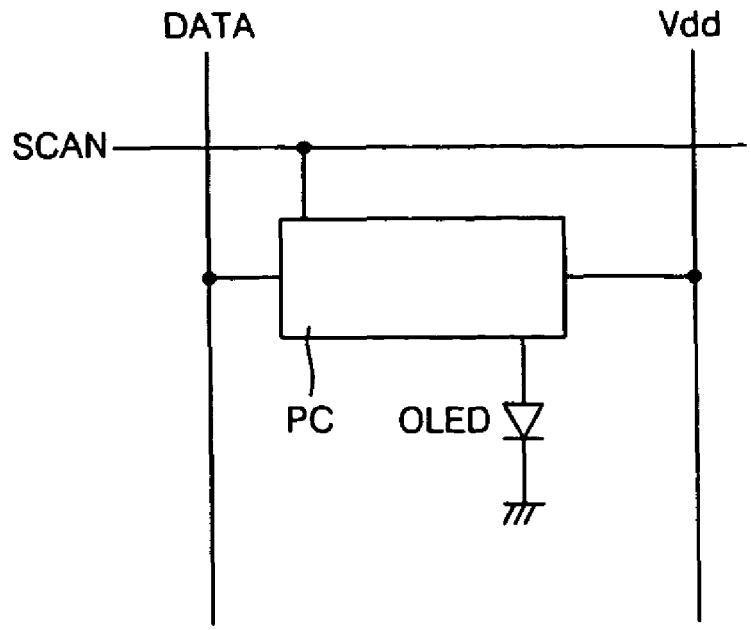
FIG. 1 illustrates a schematic diagram of a unit pixel of an exemplary flat panel display device that may include a pixel circuit according to an exemplary embodiment of the present invention.

Korean Patent Application No. 10-2005-0092147, filed on Sep. 30, 2005, in the Korean Intellectual Property Office, and entitled: "Flat Panel Display Device," is incorporated by reference herein in its entirety.

The present invention will now be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art. In the figures, the dimensions of layers and regions may be exaggerated for clarity of illustration. It will also be understood that when a layer is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

FIG. 1 illustrates a schematic diagram of an exemplary unit pixel of a flat panel display device, such as an OLED device, that may include a pixel circuit (PC) according to an exemplary embodiment of the present invention.

Referring to FIG. 1, the pixel may include a data line (DATA), a scan line (SCAN), and a Vdd power line (Vdd) that may supply power for driving the flat panel display device. The pixel circuit (PC) of the pixel may be electrically connected to the data line (DATA), the scan line (SCAN), and the Vdd power line (Vdd). The pixel circuit (PC) may also control the light emission of the flat panel display device.

Figure 2:
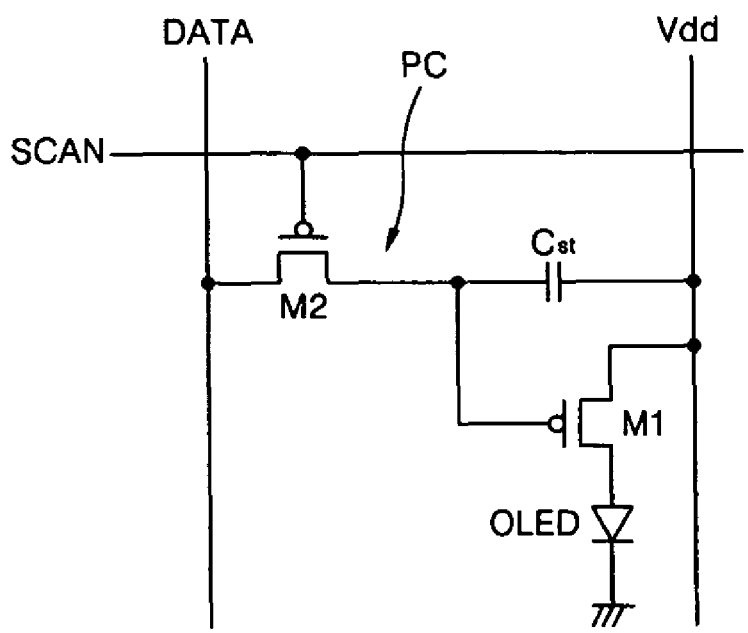
FIG. 2 illustrates a schematic diagram of an exemplary pixel circuit for the unit pixel illustrated in FIG. 1.

FIG. 2 illustrates a schematic diagram of the exemplary pixel circuit (PC) for the unit pixel illustrated in FIG. 1. The pixel circuit (PC) of each pixel may include, for example, two transistors (M1) and (M2) and one capacitor unit ($C_{st}$).

Referring to FIG. 2, each pixel circuit (PC) of the flat panel display device may include at least two thin film transistors (TFTs), i.e., a switching TFT (M2) and a driving TFT (M1), a capacitor unit ($C_{st}$) and a flat panel display, such as an OLED. The driving TFT (M1) and the switching TFT (M2) are illustrated as PMOS TFTs, but the present invention is not limited thereto, as discussed further below. For example, the driving TFT (M1) and the switching TFT (M2) may be an NMOS TFT. Also, the number of TFTs and the number of capacitors are not limited to that illustrated in FIG. 2 and may be increased as necessary.

In an exemplary operation, the switching TFT (M2) may be turned on or off by a scan signal applied to a scan line (SCAN) to transmit a data signal applied to the data line (DATA) to the storage capacitor unit ($C_{st}$) and the driving TFT (M1). The driving TFT (M1) may determine the current input to the flat panel display device according to the data signal transmitted through the switching TFT (M2). The capacitor unit ($C_{st}$) may store the data signal transmitted from the switching TFT (M2) for one frame period.

As described above, the switching device may not be limited to the switching TFT (M2) illustrated in FIG. 2. For example, the switching circuit may employ a plurality of TFTs and capacitors. Alternately, the switching circuit may further include a circuit that compensates a Vth value of the driving TFT (M1) or it may include a circuit that may compensate for a voltage drop of the Vdd power line (Vdd). Accordingly, the schematic diagram of FIG. 2 is merely illustrative and presented for discussion purposes only and should not be interpreted to limit the scope of the present invention. That is, enumerable variations of FIG. 2 may be employed, including the type of components, the number of components, etc., as already discussed above.

Figure 3:
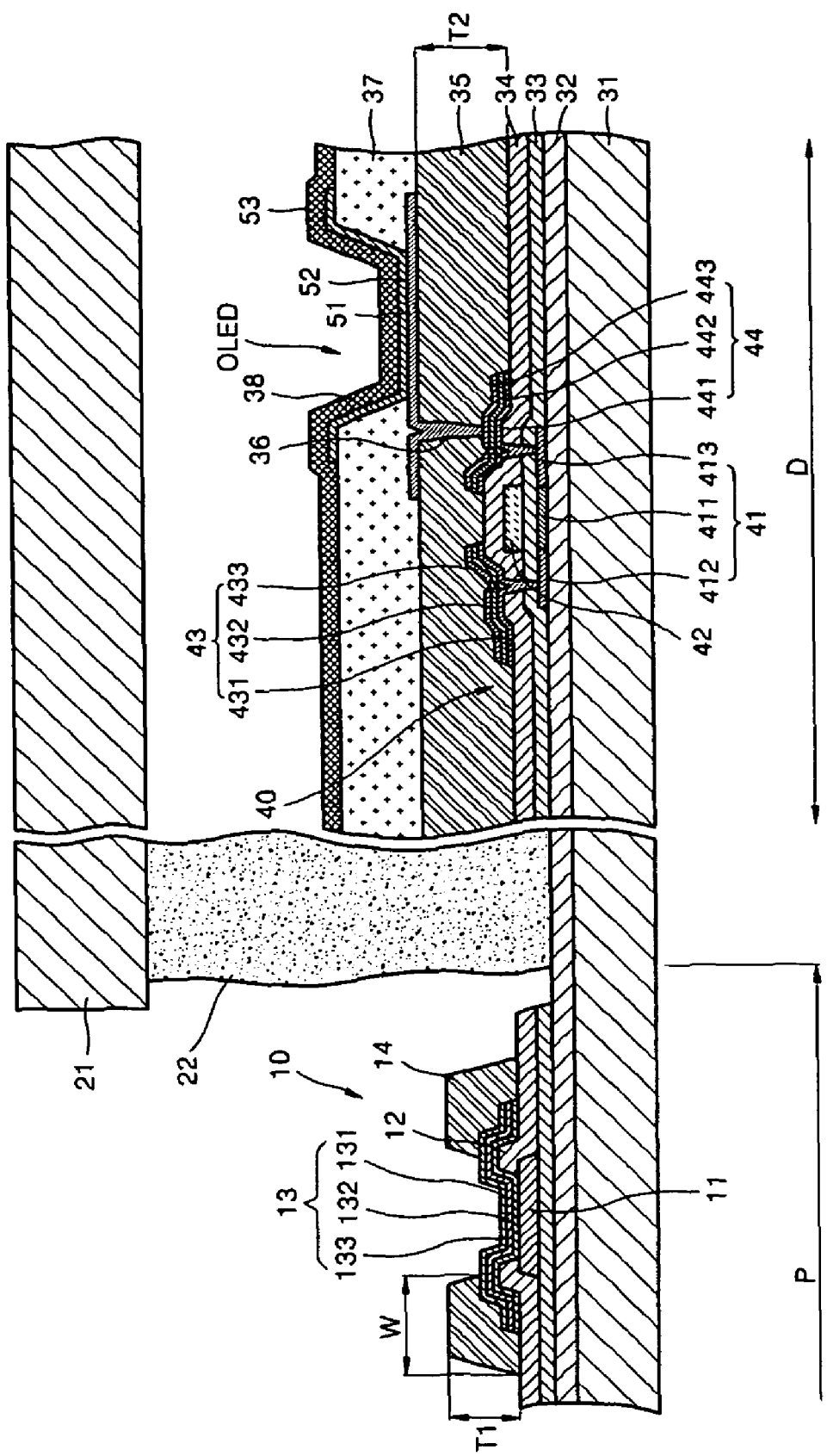
FIG. 3 illustrates a cross-sectional view of a portion of the unit pixel illustrated in FIG. 1 and an exemplary pad unit according to an exemplary embodiment of the present invention.

FIG. 3 illustrates a cross-sectional view of a portion of an exemplary pixel of FIG. 1 and an exemplary pad unit (P) according to an exemplary embodiment of the present invention. Referring to FIG. 3, the flat panel display device may include a display unit (D) and a pad unit (P) that may be electrically connected to the display unit (D). Although not illustrated, the pixel circuit (PC) may be included in the display unit (D).

The display unit (D) may include a TFT 40 and a flat panel display device, such as an OLED, formed on a substrate 31. It is to be understood that the structure of the display unit (D), including the structure of the TFT 40 is illustrative in nature and for purposes of discussion only. Accordingly, various structures for the display unit (D), other than an OLED, are possible. Further, various structures for a TFT may be used. Hence, the exemplary embodiments illustrated and discussed herein should not be interpreted to limit the scope of the present invention.

The substrate 31 may be made from a polymeric material, such as acryl, polyimide, polycarbonate, polyester, mylar, or the like. However, the present invention is not limited thereto, and may include a substrate made from, for example, a metal foil such as stainless steel, tungsten, or the like, or glass.

An insulating layer 32, such as a barrier layer and/or a buffer layer, that may prevent the diffusion of impurity ions and the penetration of moisture or external air, may be on an upper surface of the substrate 31. Also, the barrier layer and/or buffer layer may serve as a planarizing surface.

An active layer 41 may be on the insulating layer 32, and a gate insulating film 33 may cover the active layer 41. The active layer 41 may include a channel region 411 between a source region 412 and a drain region 413. The active layer 41 may be a semiconductor material such as, for example, an inorganic semiconductor material such as amorphous silicon, polysilicon, or the like or an organic semiconductor material.

A gate electrode 42 may be on the gate insulating film 33. An interlayer insulating layer 34 may cover the gate electrode 42. A source electrode 43 and a drain electrode 44 may be on the interlayer insulating layer 34. A more detailed description of the source electrode 43 and the drain electrode 44 will be discussed below. A planarizing insulating film 35 may cover the source electrode 43 and the drain electrode 44. A pixel defining film 37 may cover the planarizing insulating film 35 and a pixel electrode 51.

The gate insulating film 33, the interlayer insulating layer 34, the planarizing insulating film 35, and the pixel defining film 37 may be an insulator with a single layer structure or a multilayered structure, and may be made of an organic material, an inorganic material, or a composite organic-inorganic material.

The pixel electrode 51 that may be an electrode of, for example, an OLED, may be on the planarizing insulating film 35. The pixel defining film 37 may be on the pixel electrode 51, as discussed above. A predetermined opening 38 may be in the pixel defining film 37. After exposing the pixel electrode 51, an organic light emitting film 52 may be formed.

The exemplary flat panel display device may include the pixel electrode 51 that contacts the drain electrode 44 of the TFT 40 through a contact hole 36, a facing electrode 53 covering all of the pixels, and the organic light emitting film 52, which may be disposed between the pixel electrode 51 and the facing electrode 53. The exemplary flat panel display device may emit red, green, or blue light according to a supplied current to display a predetermined image.

The pixel electrode 51 and the facing electrode 53 may be insulated from each other by the organic light emitting film 52, and may respectively apply voltages of different polarities to the organic light emitting film 52 so that the organic light emitting film 52 may emit light.

The organic light emitting film 52 may be a low molecular weight organic film or a polymeric organic film. If the organic light emitting film 52 is a low molecular weight organic film, the organic light emitting film 52 may include a hole injection layer (HIL), a hole transport layer (HTL), an emission layer (EML), an electron transport layer (ETL), or an electron injection layer (EIL) may be stacked in a single structure or a composite structure, and may be composed of, for example, copper phthalocyanine (CuPc), N,N'-di(naphthalene-1-yl)-N,N'-diphenyl-benzidine (NPB), or tris-8-hydroxyquinoline aluminum (Alq3). The low molecular weight organic film may be formed, for example, using a vacuum evaporation method. The HIL, the HTL, the ETL, and the EIL may be common electrodes, and may be commonly formed in red, green, and blue pixels. Accordingly, the common electrodes may cover all of the pixels similar to the facing electrode 53.

The organic light emitting film 52 may also be formed of a polymeric organic film. The organic light emitting film 52 may include the HTL and the EML. The HTL may be made using a polymer solution, such as polyethylenedioxythiophene (PEDOT), and the EML may be made of, for example, poly-phenylenevinylene (PPV)-type polymers and polyfluorene. The polymeric organic film may be made by screen printing, ink jet printing, thermal laser printing or the like. Of course, the organic light emitting film 52 is not limited to the above description and may take on various other forms.

The pixel electrode 51 may operate as an anode electrode and the facing electrode 53 may operate as a cathode electrode. However, the polarity of the pixel electrode 51 and the facing electrode 53 may be reversed.

In the case of a bottom emission-type display device, the pixel electrode 51 may be a transparent electrode, and the facing electrode 53 may be a reflective electrode. The pixel electrode, i.e., the transparent electrode, may be formed of a transparent material having a high work function, such as ITO, IZO, $In_2O_3$, ZnO or the like, and the facing electrode 53, i.e., the reflective electrode, may be made of a metal having a low work function, such as Ag, Mg, Al, Pt, Pd, Au, Ni, Nd, Ir, Cr, Li, Ca, or the like or a compound of these metals or the like.

In the case of a top emission-type display device, the pixel electrode 51 may be a reflective electrode, and the facing electrode 53 may be a transparent electrode. The pixel electrode 51, i.e., the reflective electrode, may be made of a material having a high work function such as ITO, IZO, $In_2O_3$, ZnO or the like, after the facing electrode 53, i.e., the transparent electrode, is made using a metal having a low work function, such as Ag, Mg, Al, Pt, Pd, Au, Ni, Nd, Ir, Cr, Li, Ca, or the like, or a compound of these metals or the like. The facing electrode 53, i.e., the transparent electrode, may include a material layer formed of a metal having a low work function, such as Li, Ca, LiF/Ca, LiF/Al, Al, Ag, Mg, or the like, or a compound of these metals or the like, and an auxiliary electrode layer or a bus electrode line may be made using a transparent conductive material, such as ITO, IZO, ZnO, $In_2O_3$ or the like, on the material layer.

In the case of a double sided emission type display device, both the pixel electrode 51 and the facing electrode 53 may be transparent electrodes.

The materials for making the pixel electrode 51 and the facing electrode 53 are not limited to the above-described materials. In another implementation, the pixel electrode 51 and the facing electrode 53 may be made of a conductive paste containing a conductive organic material or conductive particles of Ag, Mg, Cu, or the like. In this implementation, when the conductive paste is used, the paste can be printed using, for example, an inkjet printing method. After printing the paste, the resultant product may be annealed to form an electrode.

Upon forming a flat panel display, such as an OLED, the display unit D may be sealed from the outside using a sealant member 22 and a sealing substrate 21. The adhesion between the sealant member 22 and the substrate 31 may be improved by removing the gate insulating film 33, the interlayer insulating layer 34, and the planarizing insulating film 35 from a region where the sealant member 22 may be coated, as illustrated in FIG. 3. By doing so, the sealant member 22 may not peel off from the substrate 31. It is understood, however, that the sealing structure is not limited to that discussed above, and that various sealing structures may be employed. For example, although not illustrated, a filler may be disposed between the sealing substrate 21 and the facing electrode 53. Alternately, a barrier film that may include organic films and inorganic films alternately stacked may substitute as a sealing film without using the sealing substrate 21 and the sealant member 22.

In the present exemplary embodiment, the gate electrode 42, the source electrode 43, and the drain electrode 44 may be made of a metal such as Ag, Mg, Al, Pt, Pd, Au, Ni, Nd, Ir, Cr, Li, Ca, or the like, or a compound of these metals or the like, or a transparent conductive material, such as ITO, IZO, ZnO, $In_2O_3$ or the like. Also, the gate electrode 42, the source electrode 43, and the drain electrode 44 may be made of a conductive paste containing a conductive organic material or conductive particles of Ag, Mg, Cu or the like.

Also, as illustrated in FIG. 3, the source electrode 43, the drain electrode 44 and the gate electrode 42 may be a three-layer structure. However, while the gate electrode 42 may have a single layer structure, and the source electrode 43 and the drain electrode 44 may have a three-layered structure, the present invention is not limited thereto. That is, various combinations of structures may be applied. Hereinafter, the exemplary embodiment of the present invention in which the gate electrode 42 has a single layer structure and the source electrode 43 and the drain electrode 44 have a three-layered structure as illustrated in FIG. 3 will be described.

The source electrode 43 may have a stacked structure including first, second and third conductive layers 431, 432 and 433, respectively, and the drain electrode 44 may have a stacked structure including first, second, and third conductive layers 441, 442, and 443, respectively. In one implementation, the second conductive layers 432 and 442 may be made of aluminum or an aluminum alloy, such as Al, AlSi, AlNd, AlCu or the like and at least one of the first conductive layers 431 and 441 and the third conductive layers 433 and 443 may be made of at least one material of Cr, Cr alloy, Mo, Mo alloy, W, and W alloy.

In an exemplary embodiment, the first conductive layers 431 and 441 and the third conductive layers 433 and 443 may be made of MoW, and the second conductive layers 432 and 442 may be made of AlNd. Alternately, when the second conductive layers 432 and 442 may be made of an aluminum group metal, at least one of the first conductive layers 431 and 441 and the third conductive layers 433 and 443 may be made of at least one material of Ti, a Ti alloy, Ta, and a Ta alloy.

In another exemplary embodiment, the first conductive layers 431 and 441 and the third conductive layers 433 and 443 may be made of Ti and the second conductive layers 432 and 442 may be made of an aluminum group metal.

However, the conductive layers according to embodiments of the present invention are not limited thereto. That is, a diffusion barrier film, such as a TiN film, may also be between the first conductive layers 431 and 441 and the third conductive layers 433 and 443, which may reduce ion diffusion between them.

The source electrode 43 and the drain electrode 44 may be covered by the planarizing insulating film 35. The planarizing insulating film 35 may be made from organic and/or inorganic materials. The organic material may include, for example, polymer derivatives having a phenol group, an acryl group, an imide group, an arylether group, an amide group, a fluorine group, a p-xylene group, or a vinyl alcohol group, or a mixture thereof. In an embodiment of the present invention, the planarizing insulating film 35 may be made of an acryl material, for example, a photosensitive acryl material that may be easily patterned. The inorganic material may include, for example, at least one of $SiO_2$, $SiN_x$, SiON, $Al_2O_3$, $TiO_2$, $Ta_2O_5$, $HfO_2$, $ZrO_2$, BST, PZT or the like. Further, the planarizing insulating film 35 may have a multilayered structure of organic and inorganic materials. For example, a first layer may be made of an inorganic material, and a second layer may be on the first layer to provide a planarized upper surface. The first layer and the second layer may also be reversed.

As described above, the source electrode 43 and the drain electrode 44 may have a multilayered structure. The second conductive layers 432 and 442 may be made of an aluminum group metal that may have a high conductivity. Thus, the overall conductivity of the source electrode 43 and the drain electrode 44 may be enhanced.

In the multilayered structure, the first conductive layers 431 and 441 and the third conductive layers 433 and 443 may surround the second conductive layers 432 and 442. Clads (not illustrated) may be on side surfaces of the source electrode 43 and the drain electrode 44. The clads may be made using the same material that forms the planarizing insulating film 35. The clads may prevent the second conductive layers 432 and 442 made of an aluminum group metal from becoming corroded or etched due to the penetration of an etchant through the side surfaces of the source electrode 43 and the drain electrode 44. The clads may be particularly useful for protecting the source electrode 43 and the drain electrode 44 from the penetration of an etchant if the pixel electrode 51 is patterned.

The pad unit P may include a terminal 10. The terminal 10 may be connected to external electronic devices (not illustrated) such as a chip on glass (COG) or a flexible printed circuit substrate (FPC). Alternately, a plurality of terminals 10 may be included in the pad unit P. The terminal 10 may be made when the gate electrode 42, the source electrode 43, and the drain electrode 44 of the display unit D are made.

Each terminal 10 may include a first terminal 11 and a second terminal 13. The first terminal 11 may be electrically connected to the second terminal 13 through a contact hole 12 that may be in the gate insulating film 33. The second terminal 13 may include a first conductive layer 131, a second conductive layer 132, and a third conductive layer 133. However, the terminal 10 may not necessarily be a double layer structure. That is, the terminal 10 may include only one of the first terminal 11 and the second terminal 13, or may have a triple layer structure or a quadruple layer structure using the active layer 41 and the pixel electrode 51. Materials for the first terminal 11 and the second terminal 13 are discussed above. The first terminal 11 may be made at the same time as the gate electrode 42 and the second terminal 13 may be made at the same time as the source electrode 43 and the drain electrode 44.

A clad unit 14 may cover at least a side portion of the terminal 10. The clad unit 14 may have a single or multilayered structure formed of organic or inorganic materials. The organic material may include, for example, polymer derivatives having a phenol group, an acryl group, an imide group, an arylether group, an amide group, a fluorine group, a p-xylrene group, a vinyl alcohol group, or a mixture thereof. In an exemplary embodiment of the present invention, the clad unit 14 may be made of an acryl material, for example, a photosensitive acryl material that may be easily patterned. The inorganic material may include $SiO_2$, $SiN_x$, SiON, $Al_2O_3$, $TiO_2$, $Ta_2O_5$, $HfO_2$, $ZrO_2$, BST, PZT or the like.

The clad unit 14 may protect the terminal 10 exposed to an etching solution or an etchant during an etching process, and may prevent the terminal 10 from becoming corroded by air or moisture. The clad unit 14 may also prevent corrosion of an aluminium group metal from an exposed side of the terminal 10. For example, the terminal 10 may have a multilayered structure that may include an aluminium group metal for the source and drain electrodes 43 and 44, and this multilayer structure may be exposed to the outside.

According to an exemplary embodiment of the present invention, the clad unit 14 may be made at the same time as the planarizing insulating film 35. The clad unit 14 may have a thickness T1 that may be less than the thickness T2 of the planarizing insulating film 35. The clad unit 14 and the planarizing insulating film 35, which may have different thicknesses, may be formed in a single process, such as using a halftone mask. The planarizing insulating film 35 may cover all of the pixels, and may be made to a thickness T2, for example, greater than 1.3 μm, so that the upper surface thereof may be planarized, and thus facilitating the formation of the pixel electrode 51 thereon. If the clad unit 14, which may be made at the same time as the planarizing insulating film 35, has the same thickness as the planarizing insulating film 35, a problem that will be described later may arise.

Figure 4:
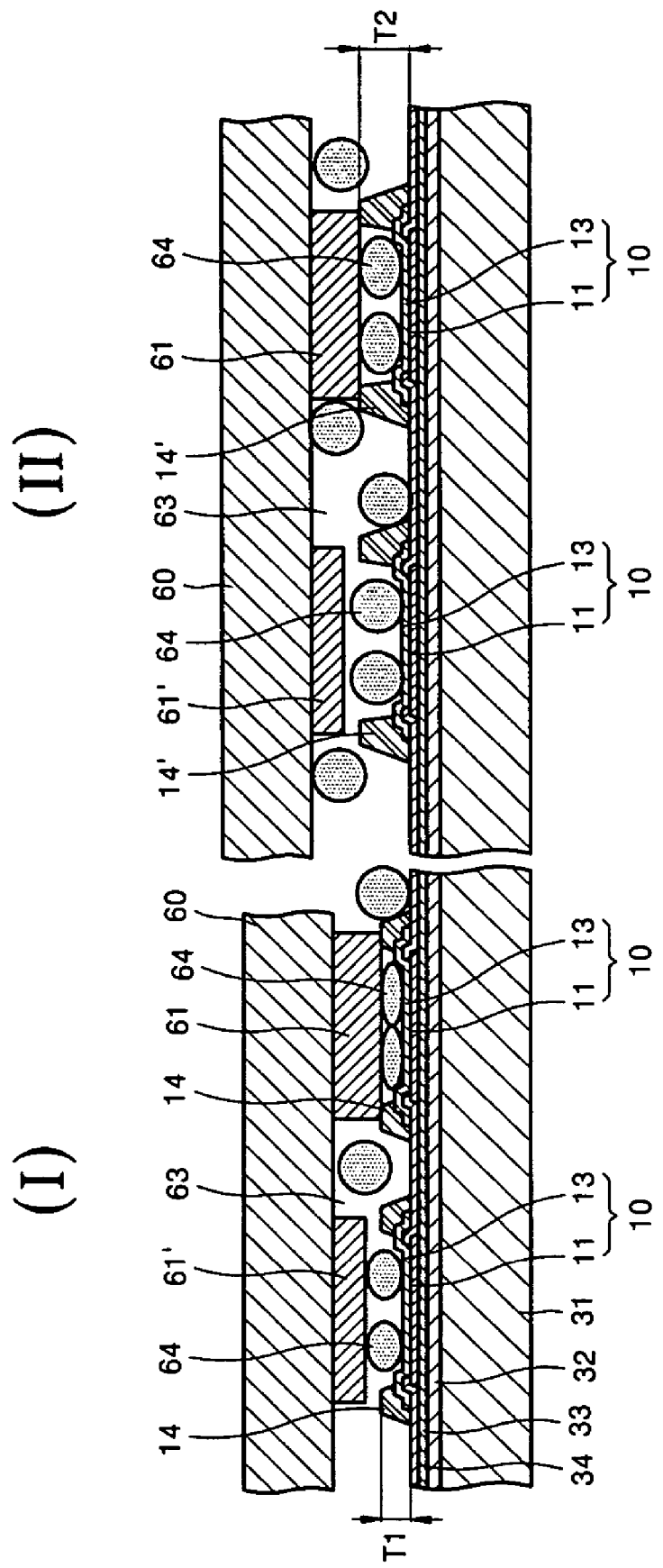
FIG. 4 illustrates a cross-sectional view of a chip on glass (COG) coupled to a terminal having a clad unit.

FIG. 4 illustrates a cross-sectional view of an exemplary COG 60 that may be coupled to the terminal 10 having the clad unit 14. In FIG. 4, two terminals 10 in region I may include the clad unit 14 with a thickness T1, which may be less than the thickness T2 of the planarizing insulating film 35 in the display unit D. FIG. 4 also illustrates two terminals 10 in region II that may include a clad unit 14' that may have a thickness T2 equal to the thickness T2 of the planarizing insulating film 35 in the display unit D.

Bumpers 61 and 61' may be on a lower surface of the COG 60 and may be connected to each of the terminals 10 and the COG 60. The terminals 10 may be coupled, for example, by an anisotropic conductive adhesive film (ACF) 63 that may contain conductive balls 64.

The bumpers 61 and 61' may have a thickness deviation of, for example, approximately ±1 μm, and the conductive balls 64 of the ACF 63 may have diameters of approximately 3 μm. Accordingly, in FIG. 4, the difference between the thicknesses of the thinnest bumper 61' and the thickest bumper 61 may be, for example, approximately 2 μm.

The clad unit 14 in region I may have a thickness T1 of, for example, approximately 0.8 μm, while the clad unit 14' in region II may have a thickness T2 of, for example, approximately 1.3 μm, which may be equal to the thickness T2 of the planarizing insulating film 35.

In this exemplary case, in region I, the distance between the thinnest bumper 61' and the surface of a second terminal 13 and the distance between the thickest bumper 61 and the surface of the second terminal 13 may be both less than the diameter of the conductive balls 64. Therefore, all the bumpers 61 and 61' and the terminals 10 may be connected.

However, in region II, when the thickest bumper 61 contacts the clad unit 14', a distance between the thinnest bumper 61' and the lower portion of the clad unit 14' may be approximately 3.3 μm. Accordingly, the conductive balls 64 located between the thinnest bumper 61' and the surface of the second terminal 13 may not be connected. Thus, a connection between the bumpers 61 and 61' and the terminals 10 may not be made.

Hence, if the clad unit 14 of the pad unit P is formed at the same time as the planarizing insulating film 35 of the display unit D, the clad unit 14 may be sufficiently thin in consideration of the diameter of the conductive balls 64. For example, the clad unit 14 may be made to a width W of greater than approximately 4 μm. However, if the clad unit 14 is too narrow, the clad unit 14 may be torn off during processing or when in use.

The above embodiments are described with respect to flat panel display device, such as an OLED, but the present invention may be applied to various other flat panel display devices such as a liquid crystal display.

According to the present invention, a clad unit covering side surfaces of a terminal of a pad unit may prevent the terminal from becoming corroded or etched by an etching solution during manufacturing. Also, if the clad unit is made at the same time as a planarizing insulating film, a connection failure between an external electronic device and the terminal may be prevented by controlling the thickness of the clad unit.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A flat panel display device, comprising:
a substrate;
a display unit including a thin film transistor on the substrate, an insulating film covering the thin film transistor, and an OLED on the insulating film, the OLED being electrically connected to the thin film transistor;
a sealing structure on the substrate, the sealing structure sealing the display unit;
a terminal on the substrate, the terminal electrically connecting the thin film transistor and or the OLED to external electronic devices, the terminal being located outside the sealing structure; and
a clad unit completely covering at least side end portions of the terminal, wherein the clad unit includes an insulating material, the clad unit is formed at the same time as the insulating film, and the clad unit is thinner than the insulating film.

2. The flat panel display device as claimed in claim 1, wherein the clad unit includes the same material as the insulating film.

3. The flat panel display device as claimed in claim 2, wherein the insulating film includes an inorganic material.

4. The flat panel display device as claimed in claim 3, wherein the inorganic material includes at least one of $SiO_2$, $SiN_x$, SiON, $Al_2O_3$, $TiO_2$, $Ta_2O_5$, $HfO_2$, $ZrO_2$, BST, and PZT.

5. The flat panel display device as claimed in claim 2, wherein the terminal is coupled to the external electronic device by an anisotropic conductive adhesive.

6. The flat panel display device as claimed in claim 2, wherein the insulating film includes an organic material.

7. The flat panel display device as claimed in claim 6, wherein the organic material includes polymer derivatives having a phenol group, an acryl group, an imide group, an arylether group, an amide group, an fluorine group, a p-xylene group, or a vinyl alcohol group, or a mixture thereof.

8. The flat panel display device as claimed in claim 1, wherein the terminal includes a first terminal and a second terminal disposed on the first terminal, the first terminal including at least one of Ag, Mg, Al, Pt, Pd, Au, Ni, Nd, Ir, Cr, Li, Ca, ITO, IZO, ZnO, and $In_2O_3$, and the second terminal including a first conductive layer, a second conductive layer, and a third conductive layer.

9. The flat panel display device as claimed in claim 8, wherein the thin film transistor includes a gate electrode, a source electrode, and a drain electrode, the gate electrode including the same material as the first terminal, and the source and drain electrodes including the same first conductive layer, second conductive layer, and third conductive layer as the second terminal.

* * * * *